United States Patent
Yamamoto et al.

(10) Patent No.: US 7,180,149 B2
(45) Date of Patent: Feb. 20, 2007

(54) SEMICONDUCTOR PACKAGE WITH THROUGH-HOLE

(75) Inventors: Satoshi Yamamoto, Tokyo (JP); Tatsuo Suemasu, Tokyo (JP); Sayaka Hirafune, Tokyo (JP); Toshihiko Isokawa, Ina (JP); Koichi Shiotani, Kamiina-gun (JP); Kazuya Matsumoto, Kamiina-gun (JP)

(73) Assignees: Fujikura Ltd., Tokyo (JP); Olympus Corporation, Tokyo (JP)

( * ) Notice: Subject to any disclaimer, the term of this patent is extended or adjusted under 35 U.S.C. 154(b) by 135 days.

(21) Appl. No.: 10/924,205

(22) Filed: Aug. 24, 2004

(65) Prior Publication Data
US 2005/0056903 A1 Mar. 17, 2005

(30) Foreign Application Priority Data
Aug. 28, 2003 (JP) ............................. 2003-304848
Dec. 17, 2003 (JP) ............................. 2003-419613

(51) Int. Cl.
*H01L 31/0203* (2006.01)

(52) U.S. Cl. ..................... 257/434; 257/433; 257/774; 257/777

(58) Field of Classification Search ................ 257/433, 257/434, 774, 777
See application file for complete search history.

(56) References Cited

U.S. PATENT DOCUMENTS

| 6,239,495 | B1 * | 5/2001 | Sakui et al. ................. 257/777 |
| 6,703,689 | B2 | 3/2004 | Wada |
| 6,720,661 | B2 | 4/2004 | Hanaoka et al. |
| 6,864,172 | B2 * | 3/2005 | Noma et al. ................. 438/674 |
| 7,022,609 | B2 * | 4/2006 | Yamamoto et al. ......... 438/694 |
| 2002/0019069 | A1 | 2/2002 | Wada |
| 2002/0030245 | A1 | 3/2002 | Hanaoka et al. |

FOREIGN PATENT DOCUMENTS

| JP | 9-511097 | 11/1997 |
| JP | 2001-351997 | 12/2001 |
| JP | 3313547 | 5/2002 |
| JP | 2002-329852 | 11/2002 |

* cited by examiner

*Primary Examiner*—Gene M. Munson
(74) *Attorney, Agent, or Firm*—Westerman, Hattori, Daniels & Adrian, LLP.

(57) ABSTRACT

A semiconductor package of the invention comprises: a semiconductor element provided with a circuit element on one surface of a semiconductor substrate; an external wiring region provided on an other surface of the semiconductor substrate; a support substrate disposed on the one surface of the semiconductor substrate; an electrode pad disposed on the one surface of the semiconductor substrate; and a through-electrode which extends from the electrode pad through to the other surface of the semiconductor substrate.

11 Claims, 11 Drawing Sheets

SEMICONDUCTOR PACKAGE WITH THROUGH-HOLE

BACKGROUND OF THE INVENTION

1. Field of the Invention

The present invention relates primarily to chip size semiconductor packages comprising semiconductor integrated circuits, particularly solid-state image sensors such as CCD and CMOS, and a method of manufacturing these packages.

Priority is claimed on Japanese Patent Application No. 2003-304848, filed on Aug. 28, 2003, and Japanese Patent Application No. 2003-419613, filed on Dec. 17, 2003, the contents of which are incorporated herein by reference.

2. Description of Related Art

Conventionally, when mounting semiconductor integrated circuits, particularly solid-state image sensors including CCD (Charge Coupled Device) or CMOS (Complementary Metal-Oxide Semiconductor), the method shown in FIG. 13 is typically used. That is, in this mounting method, a solid state image sensor 1001 is placed in a receptacle 1002 made of ceramic or resin or the like, wire bonding 1003 is performed between the sensor and a lead frame (not shown) to provide an electrical connection, and a glass lid 1004 is then fitted to provide a hermetic seal. Reference numeral 1005 indicates an outer lead.

Recently, with the progress in miniaturization, particularly in portable devices, there has been a demand for smaller housings and internal circuit boards. Of course, the demand for such miniaturization also exists for semiconductor elements, which are one of the surface mounted components which make up a circuit board. Furthermore, the same miniaturization is demanded of solid-state image sensors, which are a form of semiconductor element.

In order to meet this demand for miniaturization of semiconductor elements, research and development is being actively pursued in the field of Chip Size Packages (referred to as "CSP" below). Above all, in recent years the development of wafer level CSPs is being actively pursued with an object of providing smaller, lighter and thinner packages.

As described in the specification of Japanese Patent No. 3313547, a wafer level CSP typically has resin and rewiring on the silicon wafer element surface, and also has metal posts or solder balls for providing solder connections, arranged in the desired locations on the silicon wafer element surface.

In Japanese Unexamined Patent Application, First Publication No. 2001-351997, a CSP is proposed in which the rewiring and the solder balls and the like are placed on a semiconductor substrate surface which is opposite to that on which the semiconductor element is formed.

In National Publication of Japanese Translated Version No. H09-511097 (PCT publication No. WO95/19645), it is disclosed that by making use of partial notches provided in the silicon substrate, the metal wires which extend from the electrode pads on the surface where the element is formed can be provided on the opposite surface.

SUMMARY OF THE INVENTION

A semiconductor package according to the present invention includes: a semiconductor element provided with a circuit element on one surface of a semiconductor substrate; an external wiring region provided on an other surface of the semiconductor substrate; a support substrate disposed on the one surface of the semiconductor substrate; an electrode pad disposed on the one surface of the semiconductor substrate; and a through-electrode which extends from the electrode pad through to the other surface of the semiconductor substrate.

A connection section for providing a connection to an external terminal may be provided on the external wiring region.

An adhesive layer may be provided on the one surface of the semiconductor substrate, and this adhesive layer may adhere and secure the one surface of the semiconductor substrate to the support substrate.

The electrode pad may be disposed on the one surface of the semiconductor substrate in that region where the circuit element is not present.

An external wire which extends from the through-electrode and connects to the external wiring region may be provided.

The entire other surface side of the semiconductor substrate, excluding the connection section, may be covered by a protective film.

The support substrate may be made of a material which is optically transparent.

The adhesive layer may be provided at least on the one surface of the semiconductor substrate, in a region where the electrode pad is provided.

The external wiring region may be arranged in an opposing relationship to an external terminal.

Two or more semiconductor substrates may be provided in a layered configuration.

An external wire for connecting to a terminal of another semiconductor element may extend from the through-electrode.

Those parts of the through-electrode which are bonded to the electrode pad may be provided within a plane of the electrode pad.

A semiconductor package manufacturing method of manufacturing a semiconductor package comprising a semiconductor element with a circuit element provided on one surface of a semiconductor substrate and an external wiring region provided on an other surface of said semiconductor substrate according to the present invention includes a step A of adhering and securing a support substrate to the one surface of said semiconductor substrate; a step B of thinning the other surface of the semiconductor substrate; a step C of forming a through-hole which reaches through to an electrode pad disposed on the one surface of the semiconductor substrate, from the other surface of the semiconductor substrate; and a step D of forming a through-electrode in the through-hole.

In the step C, the through-hole may be formed so that at least in that part where the through-hole contacts the electrode pad, a cross section of the through-hole is disposed inside the electrode pad.

In the step C, the formation of the through-hole may be halted at the point in time when the electrode pad is exposed inside the through-hole.

In the step D, an external wire for connecting the external wiring region to the through-electrode may be formed at the same time as the through-electrode is formed inside the through-hole.

In the step D, a connection section for connecting to an external terminal may be provided on the external wiring region.

In the step A, a semiconductor element which includes a semiconductor substrate in wafer form may be prepared, and after the step D, there may be a step E of dicing the semiconductor substrate in wafer form.

A semiconductor substrate may be used in which the electrode pad is arranged on the one surface of the semiconductor substrate, in a region where the circuit element is not provided.

After the step D, there may be a step of covering the entire other surface side of the semiconductor substrate, except for the connection section with a protective film.

DETAILED DESCRIPTION OF THE PREFERRED EMBODIMENTS

As follows is a description of the preferred embodiments of the present invention, with reference to the drawings. However, the present invention is not limited to the embodiments below, and for example the structural elements of these embodiments may be appropriately interchanged.

(First Aspect)

First, a semiconductor package according to a first aspect of the present invention is described with reference to FIG. 1A through FIG. 3D.

Figure 1A:
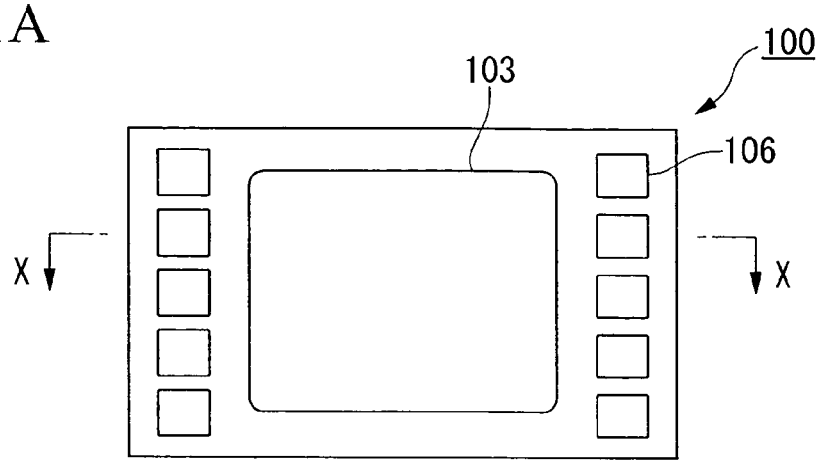
FIG. 1A is a plan view showing an example of a semiconductor package according to a first aspect of the present invention.
Figure 1B:
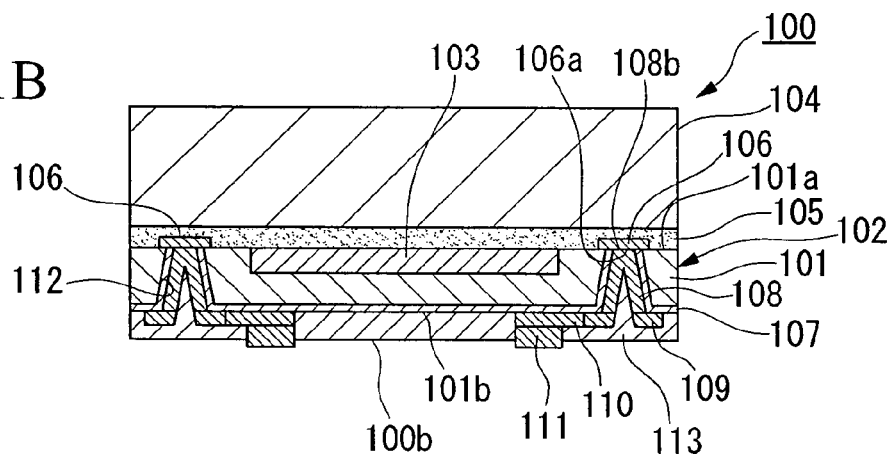
FIG. 1B is an outline cross-sectional view along the line X—X in FIG. 1A.
Figure 1C:
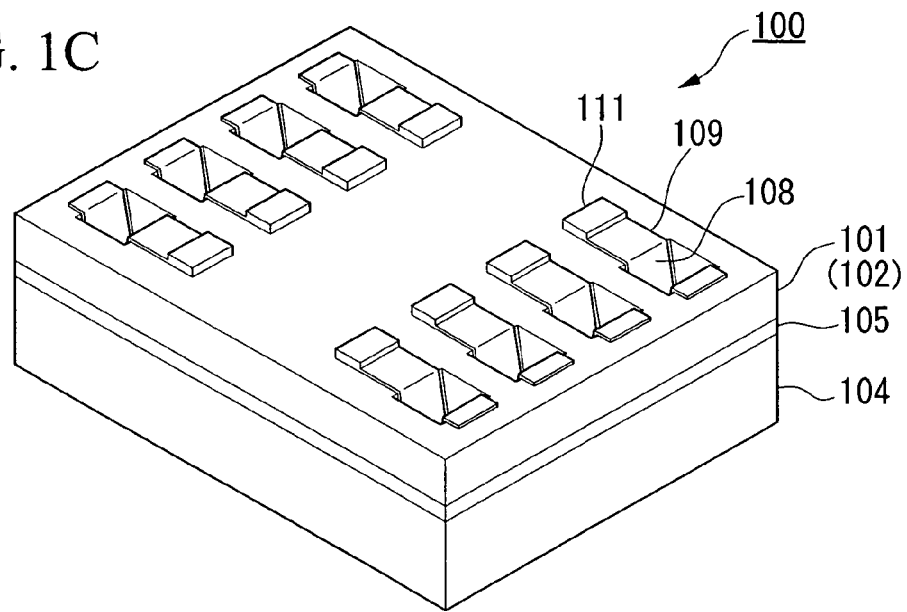
FIG. 1C is a perspective view of another example of the semiconductor package according to the first aspect of the present invention, seen from the part corresponding to the base in FIG. 1A.

FIG. 1A is a plan view showing an example of the semiconductor package according to the first aspect of the present invention. FIG. 1B is a cross-sectional view along the line X—X in FIG. 1A. FIG. 1C is another example of a semiconductor package according to the first aspect of the present invention, representing a perspective view seen from the part corresponding to the base in FIG. 1A. The semiconductor packages shown in FIG. 1A through FIG. 1C are shown after being cut into individual chips by a dicing process. Furthermore, the semiconductor package shown in FIG. 1C has the same construction as that shown in FIG. 1A and FIG. 1B, with the exception that a protective layer 113 is not provided.

Figure 2:
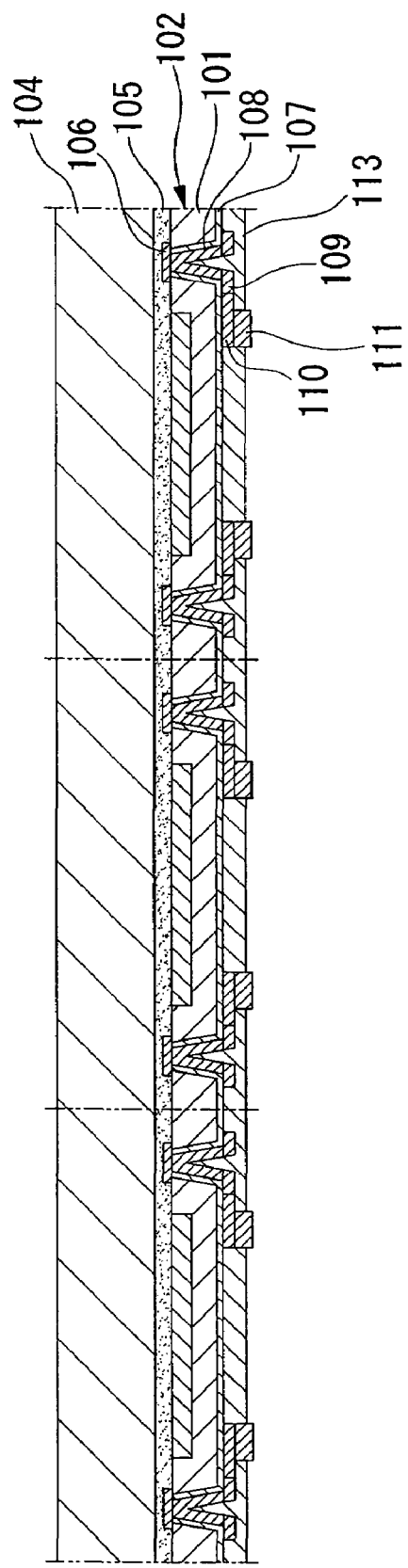
FIG. 2 is an outline cross-sectional view showing an example of semiconductor packages according to the first aspect of the present invention in wafer form.

FIG. 2 is a cross-sectional view showing an example of semiconductor packages in wafer form before being cut into individual chips. In the present invention, semiconductor packages which are prepared by using a semiconductor substrate in wafer form and in a state they are not cut into individual chips are defined as the semiconductor packages in wafer form.

In FIG. 1A through FIG. 1C, and FIG. 2, reference numeral 100 indicates a semiconductor package, 101 indicates a semiconductor substrate, 102 indicates a semiconductor element, 103 indicates a circuit element, 104 indicates a support substrate, 105 indicates an adhesive layer, 106 indicates an electrode pad, 107 indicates an electrical insulation film, 108 indicates a through-electrode, 109 indicates an external wire, 110 indicates an external wiring region, 111 indicates a metal post, 112 indicates a through-hole, and 113 indicates a protective film.

The description below uses the example of a solid-state image sensor as the semiconductor element 102. Furthermore, the description omits a detailed description of the construction and the like of the semiconductor element itself, describing only those parts which relate to the present invention.

As shown in FIG. 1B, in this semiconductor package 100, the semiconductor element 102, including a circuit element 103 including a light receiving sensor (not shown), and a signal processing circuit (not shown) and the like, provided on one surface 101a of the semiconductor substrate 101, is bonded to the support substrate 104 by the adhesive layer 105.

The electrode pads 106 are provided in regions of the surface 101a of the semiconductor substrate 101 where the circuit element is not formed. In the semiconductor substrate 101, through-holes 112 are formed in the sections where the electrode pads are provided, from the other surface 101b through to the one surface 101a.

Furthermore, electrical insulation film 107 is provided on the other surface 101b of the semiconductor substrate 101, and on the inside surface of the through-holes 112. In addition, through-electrodes 108 are provided inside the through-holes 112 via the electrical insulation film 107. The section 108b of the through-electrodes 108 which contacts the electrode pad 106 is provided within the plane of the bottom surface 106a of the electrode pad 106. In other words, the cross-sectional area of the section 108b of the through-electrodes 108 which contacts the electrode pad 106 is less than the area of the bottom surface 106a of the electrode pad 106, and the through-electrodes 108 are formed such that the section 108b which contacts the electrode pad 106 does not protrude from the bottom surface 106a. Furthermore, in the semiconductor package 100 used as an example in FIG. 1B, the section 108b of the through-electrodes 108 which contacts the electrode pad 106 is the end face nearest the surface 101a of the semiconductor substrate 101, hence the end face which joins the electrode pad 106.

The shape of the through-holes 112 and the through-electrodes 108 in the cross-sectional direction of the semiconductor package 100 is not limited to that shown in FIG. 1, and abnormal shapes, such as thick in the middle or narrow in the middle (that is the approximate center is thicker or thinner than the ends), may also be used.

The external wires 109 which extend from the through-electrodes 108 are provided on the other surface 101b via the electrical insulation film 107.

External wiring regions 110 are provided on the other surface 101b, and are connected electrically to one end of the external wires 109. Furthermore, metal posts 111, acting as a connection section, are provided on the external wiring regions 110 so as to protrude from the surface of the protective film 113 which covers the other surface 101b of the semiconductor package 100. Providing these metal posts 111 allows the semiconductor package 100 to be connected to the external terminals of another substrate or the like more easily.

The other surface 101b of the semiconductor substrate 101 is covered with the protective layer 113, except for where the metal posts 111 are provided.

As shown in FIG. 1C, it is possible to not provide the protective film 113, leaving the through-electrodes 108 and the external wires exposed.

Semiconductor silicon substrates and the like can be used as the semiconductor substrate 101.

As the support substrate 104, a substrate is used which is made of a material having sufficient practical transmissivity of the wavelength sensitivity range, that is the effective wavelength range, of the solid-state image sensor, namely the semiconductor element 102. Particularly, the material preferably has a coefficient of thermal expansion which closely matches that of the semiconductor silicon substrate at the bonding temperature when bonded to the semiconductor element 102.

The adhesive material which makes up the adhesive layer 105 is made of a material which has properties of electric insulation, and has sufficient transmissivity. Preferred adhesive materials for the adhesive layer 105 include polyimide resin, epoxy resin, and benzocyclobutane (BCB) resin, for example.

Figure 3A:
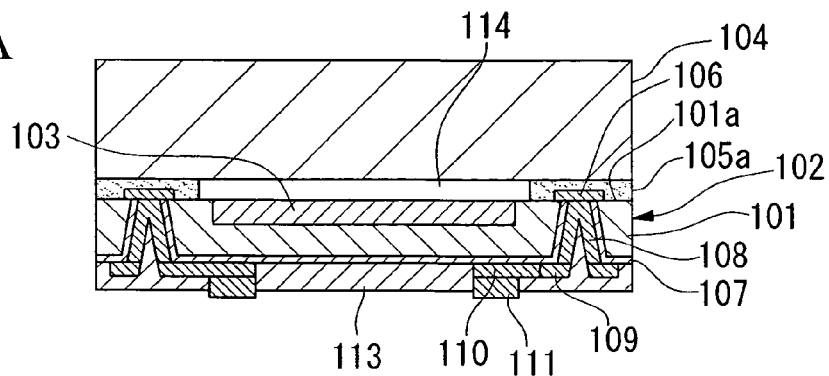
FIG. 3A is an outline cross-sectional view showing an example of the semiconductor package according to the first aspect of the present invention, where an adhesive layer pattern is provided.
Figure 3B:
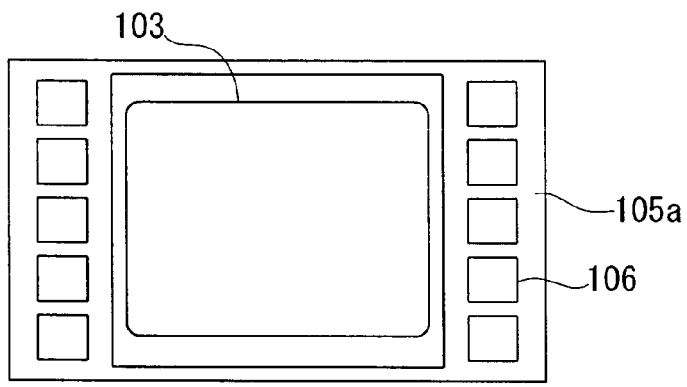
FIG. 3B is a plan view of FIG. 3A.

If a microlens (not shown) is provided on the light receiving sensor included in the circuit element 103, then as shown in FIG. 3A and FIG. 3B, as the adhesive layer 105, an adhesive layer pattern 105a which has an opening in the region over the circuit element 103 may be provided on the one surface 101a of the semiconductor substrate 101 where the electrode pads are provided. The semiconductor element 102 and the support substrate 104 are bonded together by this adhesive layer pattern 105a, thus providing a gap 114 over the circuit element 103. As a result, light from external sources can enter the microlens without passing through the adhesive layer pattern 105a, allowing sufficient optical performance by the microlens (not shown).

If the adhesive layer pattern 105a is not present above the circuit element 103 provided on the one side 101a of the semiconductor substrate 101, then sufficient transmissivity is no longer required. Accordingly, as the adhesive material which makes up the adhesive layer pattern 105a, standard thermosetting type adhesives and ultraviolet hardening type adhesives and the like can be used.

Figure 3C:
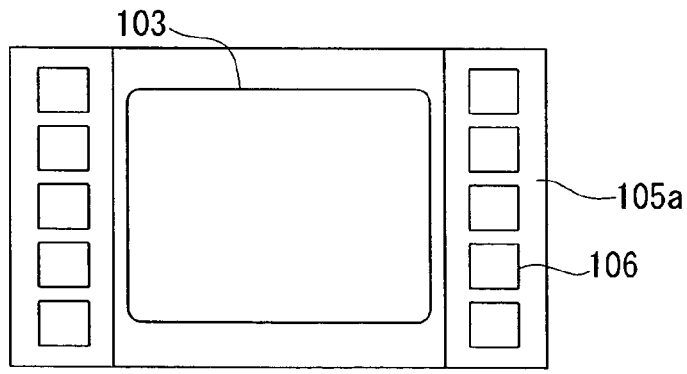
FIG. 3C is a plan view showing an example of the semiconductor package with an adhesive layer pattern different from that of the semiconductor package in FIG. 3B.
Figure 3D:
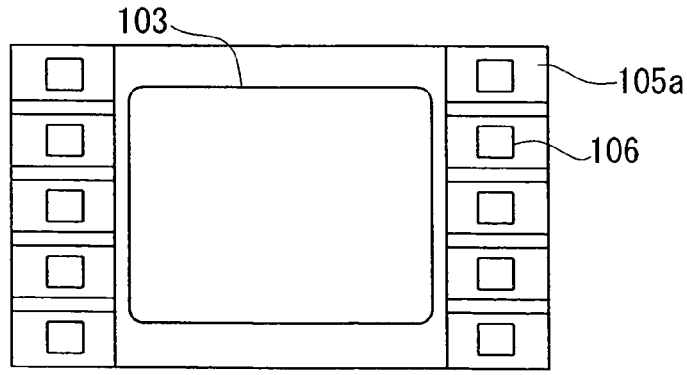
FIG. 3D is a plan view showing an example of the semiconductor package with yet another adhesive layer pattern different from that of the semiconductor package in FIG. 3B.

Furthermore, as shown in FIG. 3C, there is no need to provide the adhesive layer pattern 105a around the entire border of the circuit element 103, and it may be provided on those regions of the one surface 101a of the semiconductor substrate 101 where the electrode pads 106 are provided. In addition, as shown in FIG. 3D, the adhesive layer pattern 105a may be provided so as to cover the electrode pads 106.

In the present invention, the adhesive layer pattern 105a is not limited to the patterns described above, and any form of pattern may be used provided that it can physically reinforce the through-holes 112.

Standard materials used in the semiconductor manufacturing process such as aluminum and copper are used to make the through-electrodes 108, the external wires 109 and the external wiring regions 110, but for the electrical wiring, any material can be used provided that it is a metal which does not negatively affect the semiconductor element 102.

The material used to make up the metal posts 111 is a material which can establish a good connection with external terminals, and generally, preferable materials include copper, gold and solder.

The protective film 113 is made of a material having electrical insulating properties, sufficient thermal resistance, and sufficient corrosion resistance. The protective film 113 is preferably a silicon nitride film or silicon oxide film or the like, formed using a plasma CVD method. The material of which the protective film 113 is made may be polymeric resin material such as a polyimide resin, a epoxy resin, a benzocyclobutene (BCB) resin, or a resin for forming a solder mask, or the like.

Next, a method of manufacturing the semiconductor package according to the first aspect of the present invention is described with reference to FIG. 4A through FIG. 4D, FIG. 5A through FIG. 5C, and FIG. 6A through FIG. 6E.

FIG. 4A through FIG. 4D and FIG. 5A through FIG. 5C are cross-sectional views showing an example of a manufacturing process for semiconductor packages using a diced semiconductor element. FIG. 6A through FIG. 6E are cross-sectional views showing an example of a manufacturing process for semiconductor packages using a semiconductor substrate in wafer form.

Here, the description is based primarily on FIG. 4A through FIG. 4D and FIG. 5A through FIG. 5C.

Figure 4A:
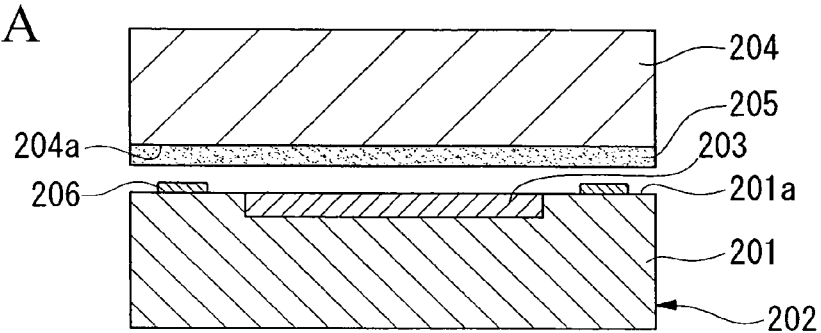
FIG. 4A is an outline cross-sectional view showing an example of a step in the semiconductor manufacturing process according to a first aspect of the present invention.

First, as shown in FIG. 4A, a semiconductor element 202, including a circuit element 203 including a light receiving sensor (not shown), and a signal processing circuit (not shown) and the like, provided on one surface 201a of the semiconductor substrate 201, and a support substrate 204 on a surface 204a of which is provided an adhesive layer 205, are prepared.

The member used as the support substrate 204 preferably has a coefficient of thermal expansion which closely matches that of the semiconductor silicon substrate 202 at the bonding temperature when bonded to the semiconductor substrate 201. Specifically, such members as those made of Pyrex (registered trademark) glass, and the glass substrates typically used in liquid crystal substrates, are suitable for use in the manufacturing method of the present aspect. If the circuit element 203 is not required to have optical characteristics, then the support substrate 204 need not be transparent.

Preferred adhesive materials for use when performing thermocompression bonding of the semiconductor element 202 and the support substrate 204 include polyimide resin, epoxy resin, or BCB resin or the like.

Because the semiconductor element 202 is a solid-state image sensor including a light receiving sensor, the adhesive material used must have sufficient practical transmissivity of the sensitive wavelength range, that is the effective wavelength range, of the semiconductor element 202.

Because of limitations imposed by the microlens (not shown) or the like placed on the light receiving sensor of the circuit element 203, if an adhesive layer pattern which has an opening so as to omit the adhesive material in the area of the circuit element 203 is used as the adhesive layer 205, then transmissivity is not required of the adhesive material, and standard thermosetting type adhesives and ultraviolet hardening type adhesives and the like can be used. In this case, the adhesive layer 205 should be thicker than the microlens.

Furthermore, the method used to bond the semiconductor element 202 and the support substrate 204 is not limited to thermocompression bonding, and any bonding method can be applied, such as metal eutectic bonding and anode bonding, provided that the bonding method does not impair the function of the semiconductor element.

Figure 4B:
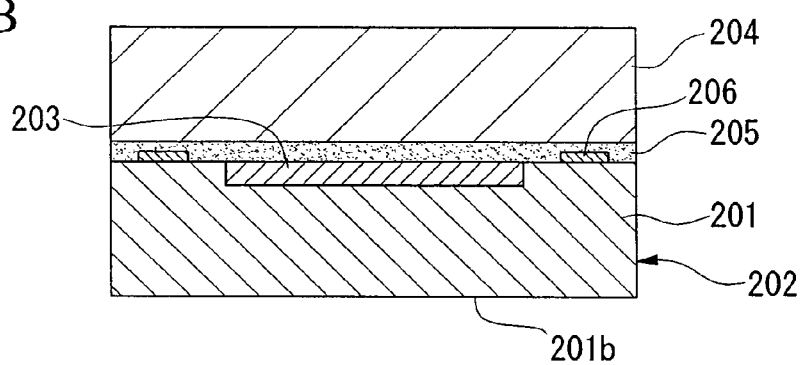
FIG. 4B is an outline cross-sectional view showing an example of a step which follows that of FIG. 4A.
Figure 6A:
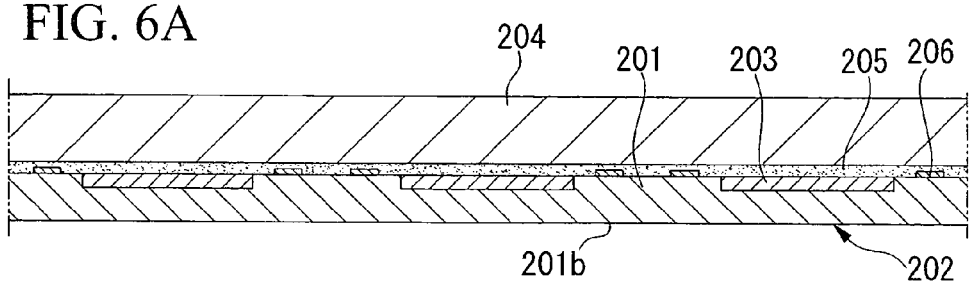
FIG. 6A is an outline cross-sectional view showing an example of a step in the semiconductor package manufacturing process using a semiconductor substrate in wafer form, according to a first aspect of the present invention.

FIG. 4B and FIG. 6A show the state of the semiconductor package after bonding of the semiconductor element 202 and the support substrate 204 is completed.

Figure 4C:
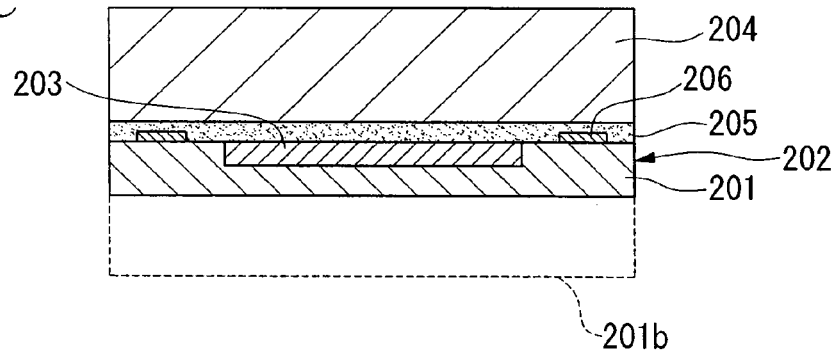
FIG. 4C is an outline cross-sectional view showing an example of a step which follows that of FIG. 4B.
Figure 6B:
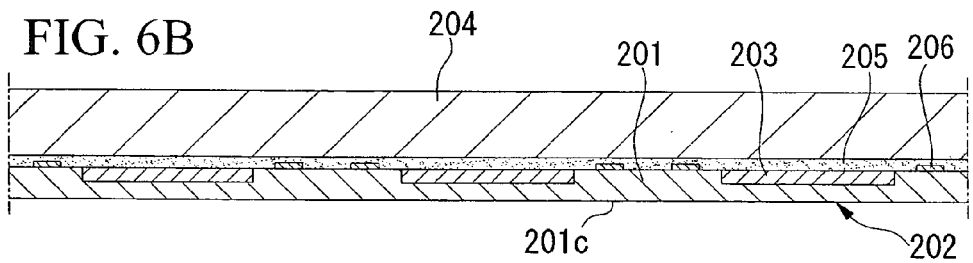
FIG. 6B is an outline cross-sectional view showing an example of a step which follows that of FIG. 6A.

As shown in FIG. 4C and FIG. 6B, the semiconductor substrate 201 is then polished and thinned down from an other surface 201b side of the semiconductor substrate 201.

In this polishing process, a polishing method which uses a standard chemical mechanical polisher (CMP) or back grinder (BG) is preferred, and yet more preferable is a polishing process which uses both these devices.

The upper limit in terms of how far the semiconductor substrate 201 can be polished is determined by the maximum depth at which the circuit element 203 operates (for example the thickness of the well layer or the buried layer or the like), and the amount of polishing can be determined arbitrarily within this limit. The amount of polishing of the semiconductor substrate 201 can be determined appropriately within the range of the upper limit mentioned above based on the subsequent etching process of the semiconductor substrate 201 and the arrangement of the electrode pads 206.

In addition, the polishing process is not limited to methods using a BG or CMP, and any method may be used provided that the method can thin down the other surface 201b of the semiconductor substrate 201 evenly and does not impede the subsequent etching mask formation process. Examples of polishing methods which may be used include wet etching methods using tetramethylammonium hydroxide (TMAH) solution or potassium hydroxide (KOH) solution or the like, or dry etching methods such as reactive ion etching (RIE) and chemical dry etching (CDE).

Figure 4D:
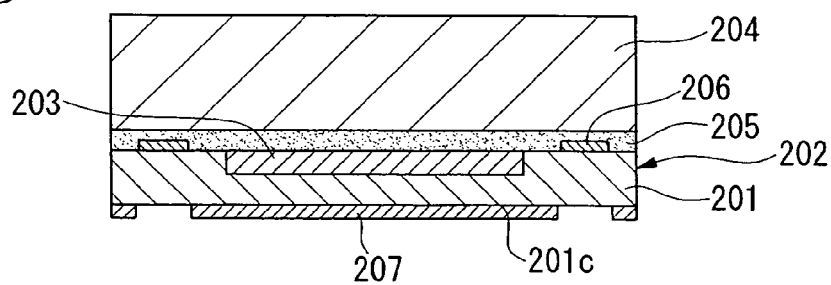
FIG. 4D is an outline cross-sectional view showing an example of a step which follows that of FIG. 4C.

As shown in FIG. 4D, pattern formation of a thin film 207 is performed on the thinned down other surface 201c of the semiconductor substrate 201, to act as a mask during subsequent etching of the semiconductor substrate 201.

The thin film 207 is preferably deposited under conditions which do not cause any deterioration in the functionality of the semiconductor element 202. Particularly, if the semiconductor element 202 is a solid-state image sensor, the thin film 207 is preferably deposited under conditions which do not cause any deterioration in the functionality of a thin film made of organic materials such as a color filter or microlens placed on the light receiving sensor of the circuit element included in the semiconductor element. The thermal resistance of the organic materials is typically around 250° C.

As the thin film 207, films which can be deposited at approximately 200° C. such as low temperature PCVD oxide films and low temperature PCVD nitride films, or films applied by spin coating such as spin on glass (SOG) films and fluororesin films, are preferable.

Furthermore, the pattern for the thin film 207 is determined as appropriate according to the etching pattern of the subsequent etching process of the semiconductor substrate 201. For a silicon (100) substrate of the type typically used to form semiconductor elements, in terms of the ease of performing subsequent anisotropic etching of the semiconductor substrate 201, the thin film 207 preferably has a rectangular pattern.

Figure 5A:
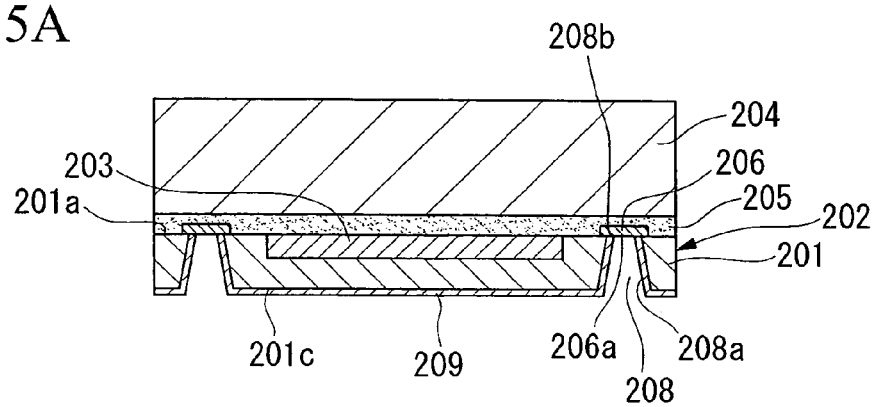
FIG. 5A is an outline cross-sectional view showing an example of a step which follows that of FIG. 4D.
Figure 6C:
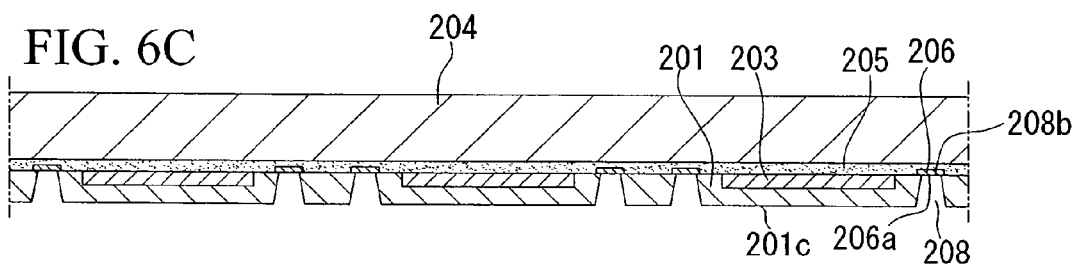
FIG. 6C is an outline cross-sectional view showing an example of a step which follows that of FIG. 6B.

As shown in FIG. 5A and FIG. 6C, by then performing anisotropic etching of the semiconductor substrate 201 using the thin film 207 as a mask, through-holes 208 can be formed from the other surface 201c of the semiconductor substrate 201 through to the one surface 201a, in the locations of the electrode pads 206. Consequently, an other surface 206a (the base) of the electrode pads 206 is exposed on the other surface 201*b* side of the semiconductor substrate 201, via the through-holes 208.

Here, in this step, the through-holes 208 are formed such that in at least those parts where the through-holes 208 contact the electrode pads 206, a cross-section 208*b* perpendicular to the depth direction of the through-holes 208 is provided within the plane of the other surface (base) 206*a* of the electrode pads 206. In other words, the through-holes 208 are formed such that the entire joint surface between the through-electrodes, which are formed in a subsequent process by filling the through-holes 208 with an electroconductive material, and the electrode pads 206, is disposed within the plane of the other surface (base) 206*a* of the electrode pads 206.

In the present invention, the shape of the through-holes 208 in the cross-section direction of the semiconductor substrate 201 is not limited to that shown in FIG. 5 and FIG. 6, and the through-holes may be irregularly shaped, for example thick in the middle or narrow in the middle (that is a shape in which the approximate center is thicker or thinner than the ends).

In addition, in this step, the formation of the through-holes 208 is halted at the point in time when the other surfaces 206*a* of the electrode pads 206 are exposed inside the through-holes 208.

Here, in this step, exposing the other surface (base) 206*a* of the electrode pads 206 to the inside of the through-holes 208 means that a portion of the other surface (base) 206*a* of the electrode pad 206 with an area approximately equivalent to the size of the through-holes 208 (the area of the cross-section 208*b* perpendicular to the depth direction of the through-holes 208) is exposed.

For the anisotropic etching, a wet etching method using tetramethylammonium hydroxide (TMAH) solution or potassium hydroxide (KOH) solution or the like is preferred, but dry etching methods such as reactive ion etching (RIE) and chemical dry etching (CDE) can also be used.

In the manufacturing method of this aspect, because plasma is irradiated from the other surface 201*c* side of the semiconductor substrate 201 even when a dry etching method is used, there is no danger of the circuit element 203 being damaged by the plasma exposure, causing its performance to deteriorate.

Furthermore, in this etching step, an insulating film (not shown) such as a thermal oxidation film provided on the other surface (base) 206*a* side of the electrode pad 206 functions as an etch stopper, and the support substrate 204 bonded by the adhesive layer 205 functions as physical reinforcement for the electrode pads 206, and consequently the through-holes 208 can be formed in a stable manner. Furthermore, by using the insulating film provided on the other surface (base) 206*a* side of the electrode pad 206 as an etch stopper, the formation of the through-holes 208 can be halted at the point in time when the other surface (base) 206*a* side of the electrode pad 206 is exposed inside the through-holes 208. Accordingly, such deficiencies as the through-holes penetrating completely through to the surface of the electrode pad can be prevented. Furthermore, there is no danger of the circuit element 203 provided on the one surface 201*a* of the semiconductor substrate 201 being damaged.

Furthermore, the through-holes 208 can easily be formed so that at least in those parts where the through-holes 208 and the electrode pads 206 contact each other, the cross-section 208*b* perpendicular to the depth direction of the through-holes 208 is disposed within the plane of the other surface (base) 206*a* of the electrode pads 206. Consequently, the entire end face of the through-electrodes formed by filling the through-holes 208 with an electroconductive material can be joined completely with the other surface (base) 206*a* of the electrode pads 206. Accordingly, the wiring resistance at the connection between the electrode pads 206 and the through-electrodes can be lowered (reduced), enabling a highly reliable electrical connection. Furthermore, because the entire end face of the through-electrodes can be joined completely to the electrode pads 206, there is no deterioration in characteristics due to heat history, which enables the manufacture of a semiconductor package with high reliability.

Next, in order to insulate both the through-electrodes provided inside the through-holes 208 and the external wires extending from the through-electrodes and provided on the other surface 201*c* of the semiconductor substrate 201 from the semiconductor element 202, an electrical insulation film 209 is formed on the other surface 201*c* of the semiconductor substrate 201 and inside the through-holes 208.

In the same manner as the thin film 207 used as the etching mask, the electrical insulation film 209 is preferably deposited under conditions which do not cause any deterioration in the functionality of the circuit element 203. Particularly, if the circuit element 203 is a solid-state image sensor, then preferably the thin film 207 is deposited under conditions which do not cause any deterioration in the functionality of a thin film made of organic materials such as a color filter or a microlens placed on the light receiving sensor included in the circuit element 203. The thermal resistance of the organic materials mentioned above is typically around 250° C.

In the same manner as the thin film 207, as the electrical insulation film 209, films which can be deposited at approximately 200° C. such as low temperature PCVD oxide films and low temperature PCVD nitride films, or films applied by spin coating such as spin on glass (SOG) films and fluororesin films, are preferable.

The electrical insulation film formed on the other surface (base) 206*a* of the electrode pads 206 is then selectively removed. Here, a semiconductor lithographic process or etching process is used with a standard resist. If the through-holes 208 are deep, that is if the semiconductor substrate 201 is thick, then the resist is applied using a spray application method, and then exposed using a projection exposure device or the like with a long focal depth.

Figure 5B:
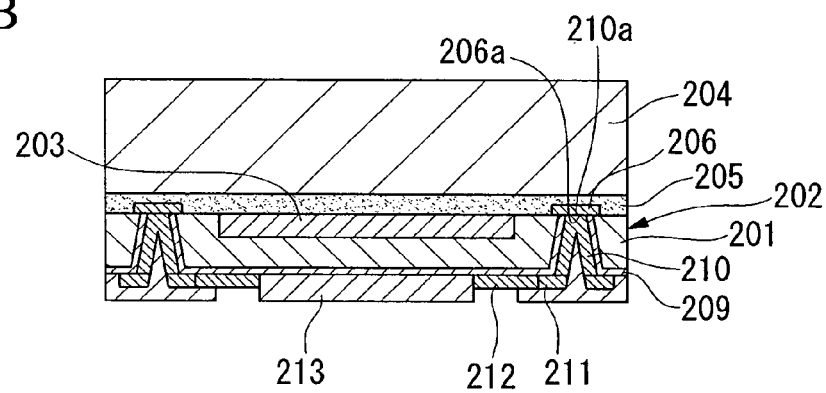
FIG. 5B is an outline cross-sectional view showing an example of a step which follows that of FIG. 5A.
Figure 6D:
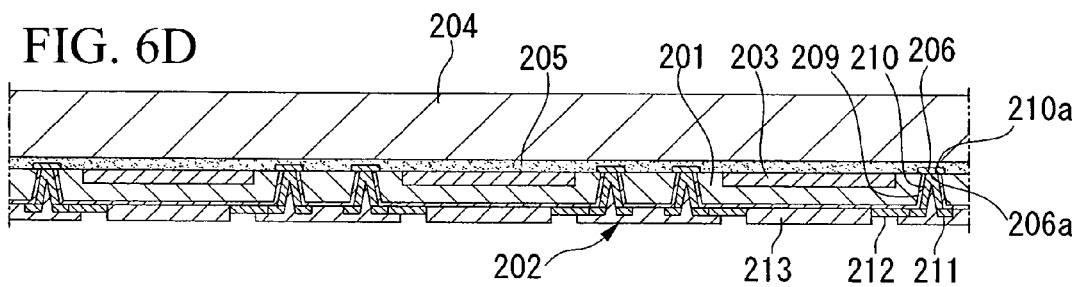
FIG. 6D is an outline cross-sectional view showing an example of a step which follows that of FIG. 6C.

As shown in FIG. 5B and FIG. 6D, through-electrodes 210 made of a metallic thin film are formed inside the through-holes 208 with the other surface (base) 206*a* of the electrode pads 206 at their base end. Furthermore, external wires 211, which extend from the through-electrodes 210, are formed on the other surface 201*c* of the semiconductor substrate 201. External wiring regions 212, connected to one end of the external wires 211, are formed in an opposing relationship to the external terminals of another substrate (not shown).

The through-electrodes 210, the external wires 211 and the external wiring regions 212 are all formed at the same time, by first forming a metallic thin film using a standard sputtering method or evaporation method or the like, and then patterning the metallic thin film into the desired shape using a semiconductor photolithographic process and etching process. In the same manner as the removal of the electrical insulation film described above, if the through-holes 208 are deep, then the resist is applied using a spray application method, and then exposed using a projection exposure device or the like with a long focal depth.

From the viewpoint of improving reliability, preferably plating surface treatment with nickel or gold or the like is performed on the surfaces of the patterned through-electrodes 210, external wires 211 and external wiring regions 212, as needed.

Normally, aluminum is used to make the through-electrodes 210, the external wires 211 and the external wiring regions 212, but a metallic material such as copper, nickel and gold may be used, provided that the material is either the same as that used to make the electrode pads 206, or is chemically compatible.

Next, in order to shield the through-electrodes 210, the external wires 211 and the external wiring regions 212 from the outside air (moisture), a protective film 213 made of a silicon nitride film or silicon oxide film or the like is formed thereon. The protective film 213 is made of a material having electrical insulating properties, sufficient thermal resistance, and sufficient corrosion resistance. The protective film 213 is preferably a silicon nitride film or silicon oxide film or the like, formed using a plasma CVD method. For example, after the thin film which constitutes the protective film 213 is formed using a plasma CVD method or the like, the portion of the thin film which is formed on the external wiring regions 212 is selectively removed using a semiconductor photolithographic process and etching process, thereby exposing part of the external wiring regions 212.

The material of which the protective film 213 is made may be polymeric resin material such as a polyimide resin, a epoxy resin, a benzocyclobutene (BCB) resin, or a resin for forming a solder mask, or the like. For example, the protective film 213 may be made of a resin for forming a solder mask and may be combined with a solder mask for providing a connection with the external terminals of another substrate (not shown).

Figure 5C:
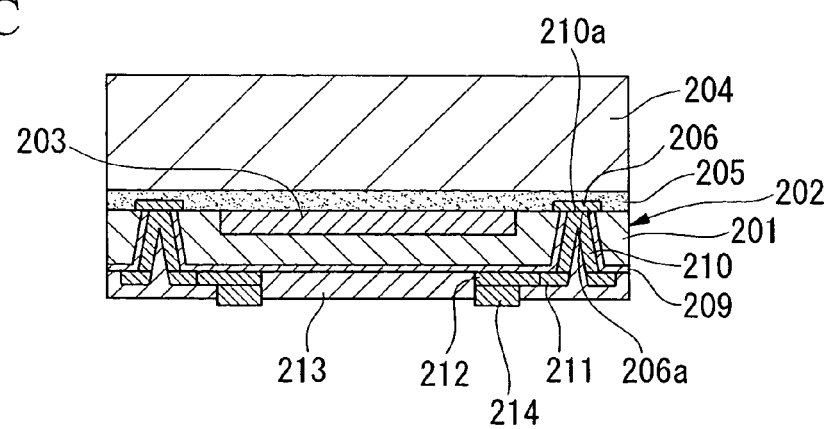
FIG. 5C is an outline cross-sectional view showing an example of a step which follows that of FIG. 5B.
Figure 6E:
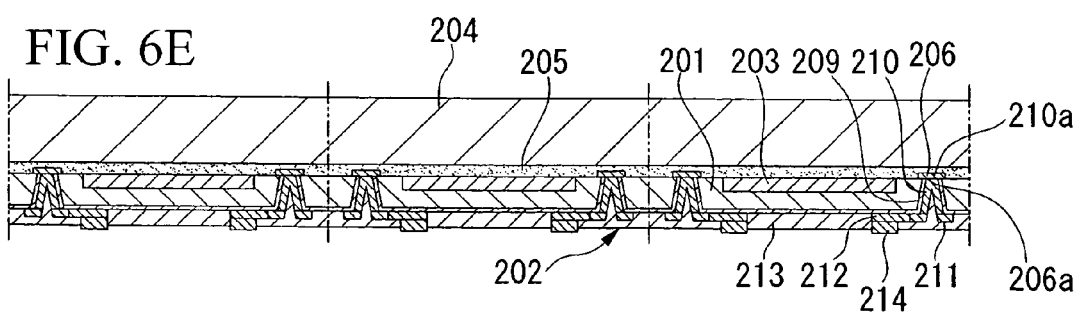
FIG. 6E is an outline cross-sectional view showing an example of a step which follows that of FIG. 6D.

As shown in FIG. 5C and FIG. 6E, metal posts 214 are formed on the exposed parts of the external wiring regions 212 so as to protrude from the surface of the protective film 213.

An electrolytic plating method or a stud bump method or the like is used to form the metal posts 214.

Copper, gold and solder and the like are preferred as the material used to make the metal posts, but other materials may be used provided that these materials enable connection to the external terminals of another substrate (not shown).

When manufacturing semiconductor packages using a semiconductor substrate in wafer form, the final step is to perform dicing of the semiconductor packages along the dicing line (the alternate dotted and dashed line in FIG. 6E). As a result semiconductor packages in chip form as shown in FIG. 5C are obtained.

To perform the dicing process, a standard dicing machine or etching machine or the like is used.

In the present invention, the semiconductor element may also be a light emitting element, a standard IC chip, or a micromachine element, as well as the solid-state image sensor used as an example in the first aspect.

According to this first aspect, wire bonding becomes unnecessary, there are no restrictions on the placement of the electrode pads provided on the one surface of the semiconductor substrate, and electrical connection is possible between the electrode pads and the external terminals of another substrate. Consequently, miniaturization of the semiconductor package can be realized.

Furthermore, by covering all parts of the other surface of the semiconductor substrate except for the metal posts with a protective film, a wiring configuration is obtained in which the metal parts on the other surface of the semiconductor substrate are not exposed. Consequently, a semiconductor package with high reliability (high moisture resistance) can be realized.

The through-electrodes and the external wires can all be processed using standard semiconductor manufacturing devices. Consequently, an inexpensive and small semiconductor package can be realized.

Photolithographic techniques used in normal semiconductor manufacturing processes can be applied to the through-electrodes and the external wires. Because the processing accuracy of the through-electrodes and the external wires is determined by the semiconductor photolithographic process, microfabrication is possible. Consequently the semiconductor package of the present invention is readily compatible with other circuit substrates in which the external terminals are formed with a fine pitch using photolithographic techniques, and interconnection of the terminals is possible. As a result it is possible to provide a semiconductor package including a plurality of semiconductor elements in a stacked arrangement, namely a semiconductor package having three dimensional layered wiring.

Furthermore, because in the semiconductor package according to the first aspect, notched regions in the form of V-shaped grooves or the like are not required, none of the semiconductor substrate is wasted, and the yield (area utilization) of the circuit element can be increased.

(Second Aspect)

Next, a semiconductor package according to a second aspect of the present invention is described with reference to FIG. 7A, FIG. 7B, FIG. 8 and FIG. 9.

Figure 7A:
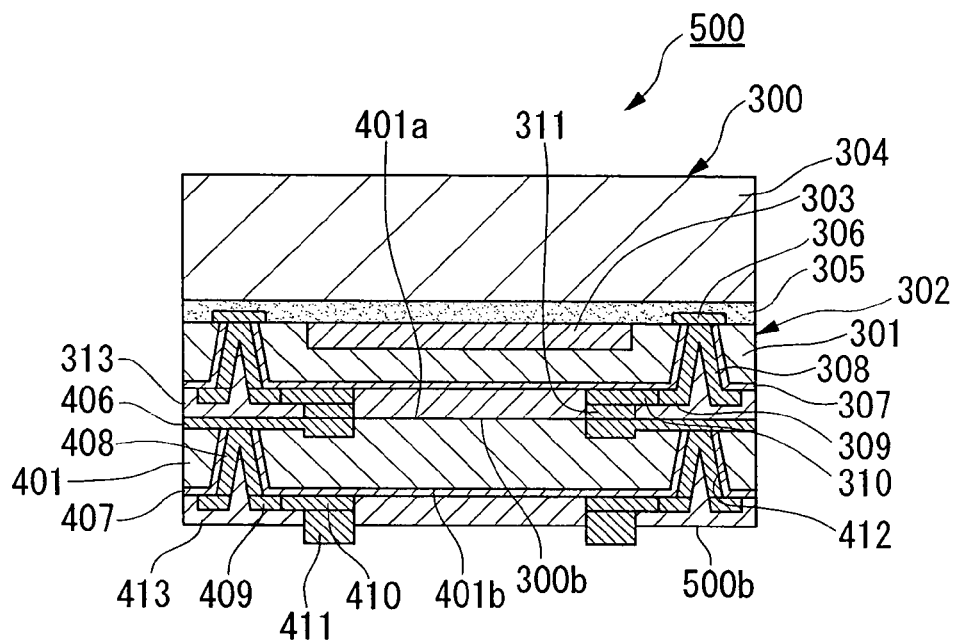
FIG. 7A is an outline cross-sectional view showing an example of a semiconductor package according to a second aspect of the present invention.
Figure 7B:
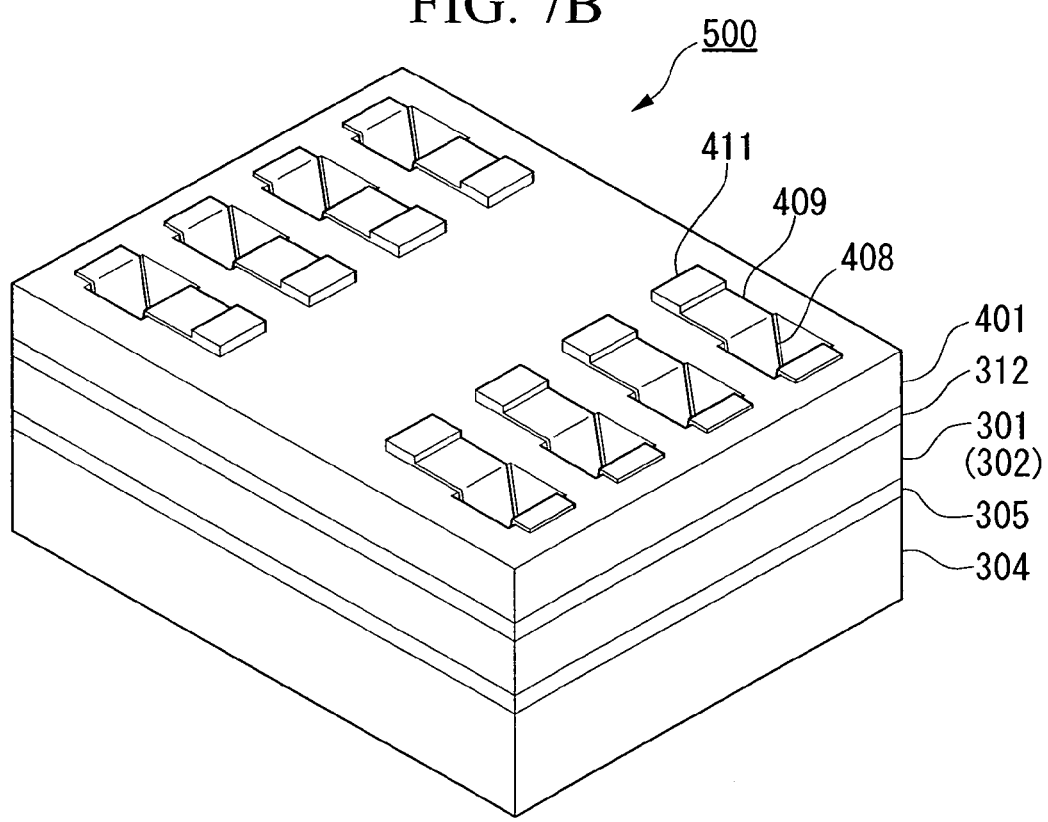
FIG. 7B is a perspective view of another example of a semiconductor package according to the second aspect of the present invention, seen from the part corresponding to the base in FIG. 7A.

FIG. 7A is an outline cross-sectional view showing an example of a semiconductor package according to the second aspect of the present invention. FIG. 7B is another example of a semiconductor package according to the second aspect, seen from the part corresponding to the base in FIG. 7A. The semiconductor packages shown in FIG. 7A and FIG. 7B have been diced. Furthermore, the semiconductor package shown in FIG. 7B has the same construction as the semiconductor package shown in FIG. 7A, with the exception that a protective film 413 is not provided.

Figure 8:
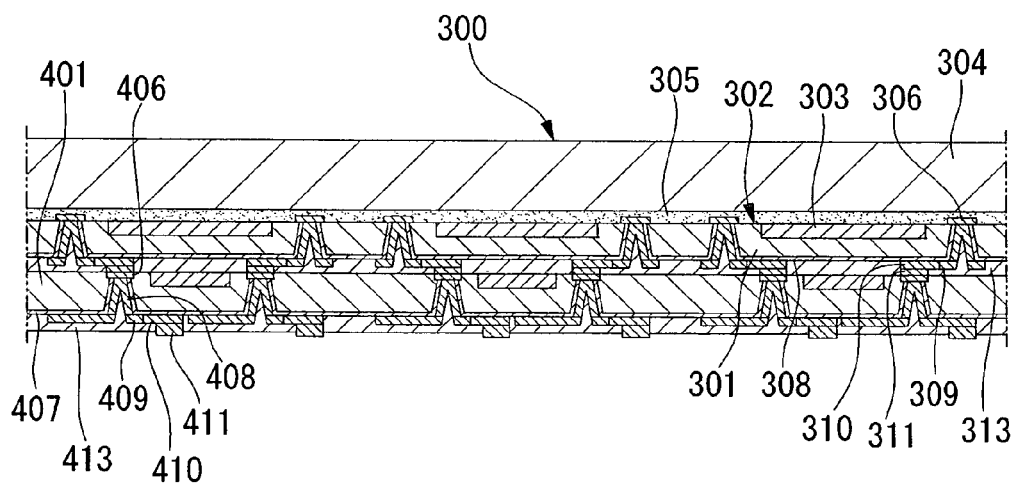
FIG. 8 is a cross-sectional view showing an example of semiconductor packages according to the second aspect of the present invention, in wafer form.

FIG. 8 is a cross-sectional view showing an example of semiconductor packages in wafer form, prior to being diced into individual chips.

In FIG. 7A, FIG. 7B and FIG. 8, reference numeral 300 indicates a semiconductor package, 301 indicates a semiconductor substrate, 302 indicates a semiconductor element, 303 indicates a circuit element, 304 indicates a support substrate, 305 indicates an adhesive layer, 306 indicates an electrode pad, 307 indicates an electrical insulation film, 308 indicates a through-electrode, 309 indicates an external wire, 310 indicates an external wiring region, 311 indicates a metal post, 313 indicates a protective film, 401 indicates a semiconductor substrate, 402 indicates a semiconductor element, 406 indicates an electrode pad, 407 indicates an electrical insulation film, 408 indicates a through-electrode, 409 indicates an external wire, 410 indicates an external wiring region, 411 indicates a metal post, 412 indicates a through-hole, 413 indicates a protective film, and 500 indicates a semiconductor package which has several semiconductor substrates in a layered configuration.

In the description below, for the circuit element 303, the example of a solid state image sensor is used. Furthermore, the description omits a detailed description of the construction and the like of the semiconductor element itself, describing only those parts which relate to the present invention.

As shown in FIG. 7A, in this semiconductor package 500, the semiconductor package 300 obtained according to the first aspect and a separate semiconductor substrate 401 having a circuit element (not shown) are provided in a layered configuration. The metal posts 311 provided so as to protrude from an other surface 300b (the under surface) of the semiconductor package 300 are connected electrically to the electrode pads 406 provided on one surface 401a (the upper surface) of the semiconductor substrate 401.

In the semiconductor substrate 401, through-holes 412 are formed in the sections where the electrode pads 406 are provided, from the other surface 401b through to the one surface 401a. Through-electrodes 408 are provided inside the through-holes 412 with the electrode pads 406 at their base end. External wires which extend from the through-electrodes 408 are provided on the other surface 401b of the semiconductor substrate 401.

External wiring regions 410 are provided on the other surface 401b, and these external wiring regions 410 are electrically connected to one end of the external wires 409. Furthermore, metal posts 411, acting as a connection section, are provided on the external wiring regions 410 so as to protrude from the surface of the protective film 413 which covers the other surface 401b of the semiconductor substrate 401. Providing these metal posts 411 allows the semiconductor substrate 401 to be easily connected to the external terminals of another substrate.

Preferred materials used to make the through-electrodes 408, the external wires 409 and the external wiring regions 410 are such materials as aluminum and copper, but any material can be used to make the electrical wiring provided that it is a metal which does not adversely affect the semiconductor package 300 and the semiconductor substrate 401.

The metal posts 411 are preferably made of materials which are suited to establishing a connection with external terminals, typically copper, gold or solder or the like.

Figure 9:
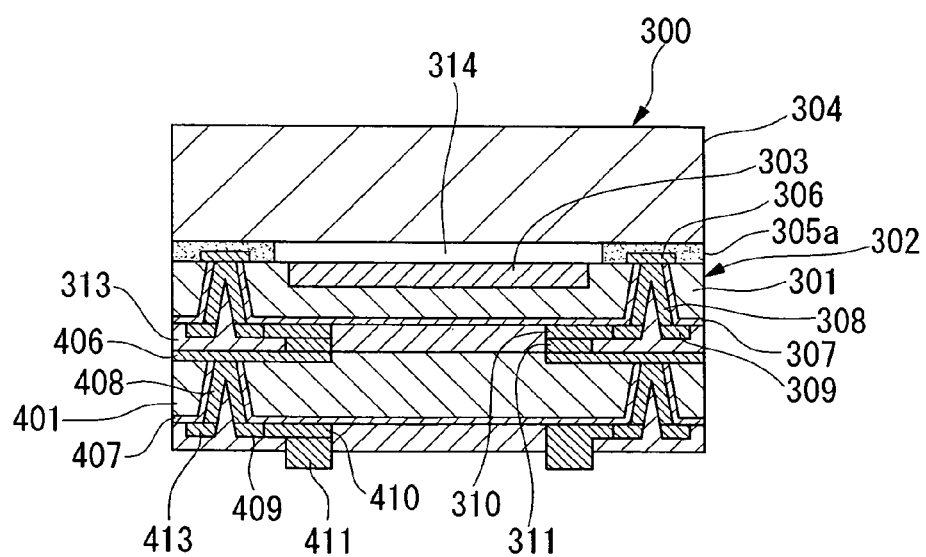
FIG. 9 is an outline cross-sectional view showing an example of the semiconductor package according to the second aspect of the present invention, where an adhesive layer pattern is provided.

If a microlens (not shown) is provided on the light receiving sensor included in the circuit element 303, then as shown in FIG. 9, an adhesive layer pattern 305a which has an opening in the region over the circuit element 303 may be provided. The semiconductor element 302 and the support substrate 304 are bonded together by the adhesive layer pattern 305a, providing a gap 314 over the circuit element 303. As a result, light from external sources can enter the microlens without passing through the adhesive layer pattern 305a, allowing sufficient optical performance by the microlens (not shown).

The construction of the semiconductor package shown here as an example is two semiconductor substrates in a layered configuration, but the semiconductor package of the present invention is not limited to this construction, and a construction with three or more semiconductor substrates in layered configuration may also be used.

Next, a method of manufacturing the semiconductor package according to the second aspect of the invention is described with reference to FIG. 10A through FIG. 10C and FIG. 11A through FIG. 11D.

Figure 10A:
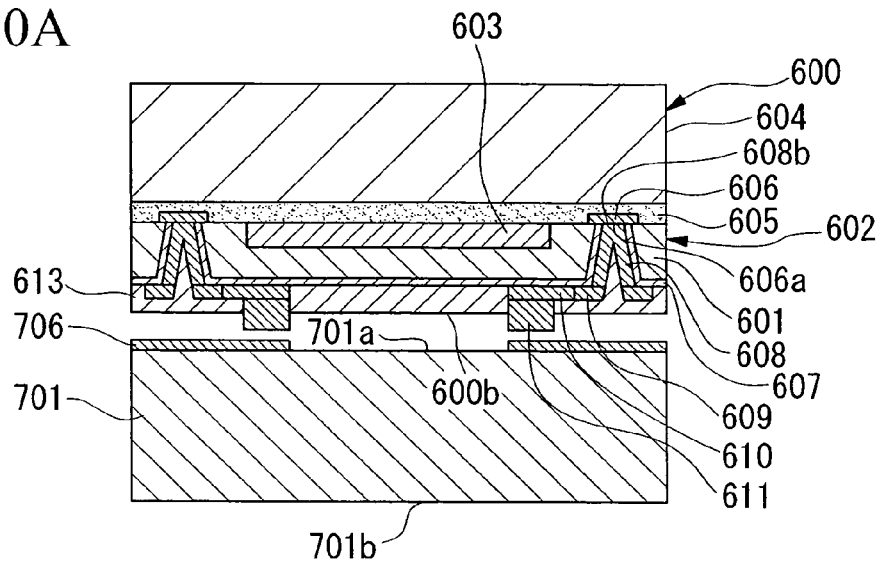
FIG. 10A is an outline cross-sectional view showing an example of a step in the semiconductor manufacturing process according to the second aspect of the present invention.
Figure 10B:
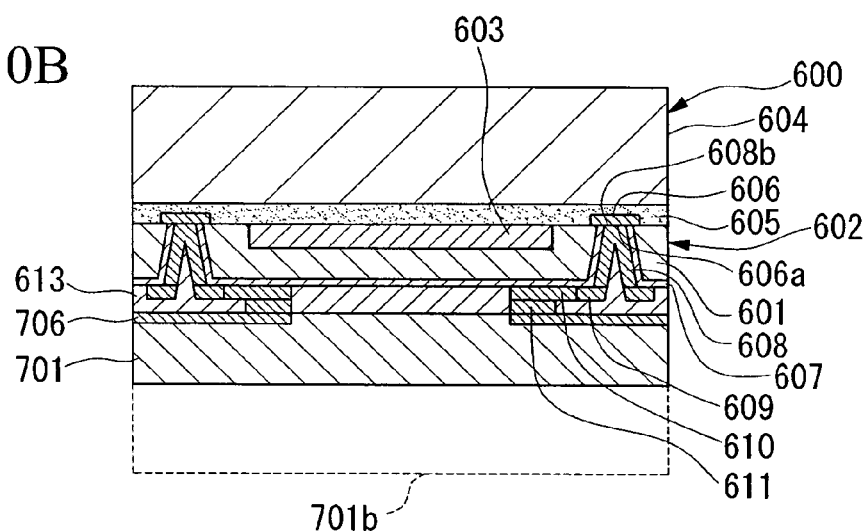
FIG. 10B is an outline cross-sectional view showing an example of a step which follows that of FIG. 10A.
Figure 10C:
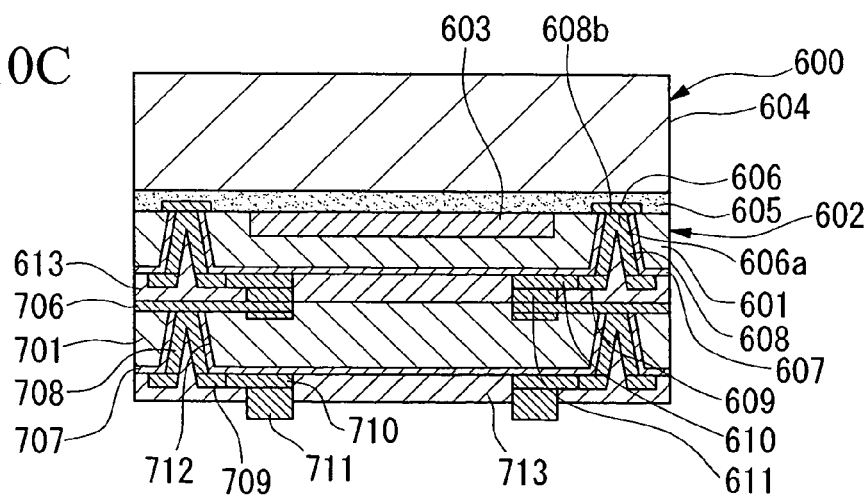
FIG. 10C is an outline cross-sectional view showing an example of a step which follows that of FIG. 10B.

FIG. 10A through FIG. 10C are cross-sectional views showing an example of a manufacturing process for semiconductor packages using a diced semiconductor substrate. FIG. 11A through FIG. 11D are cross-sectional views showing an example of a manufacturing process for semiconductor packages using a semiconductor substrate in wafer form.

Here, the description will center on FIG. 10A through FIG. 10C.

Figure 11A:
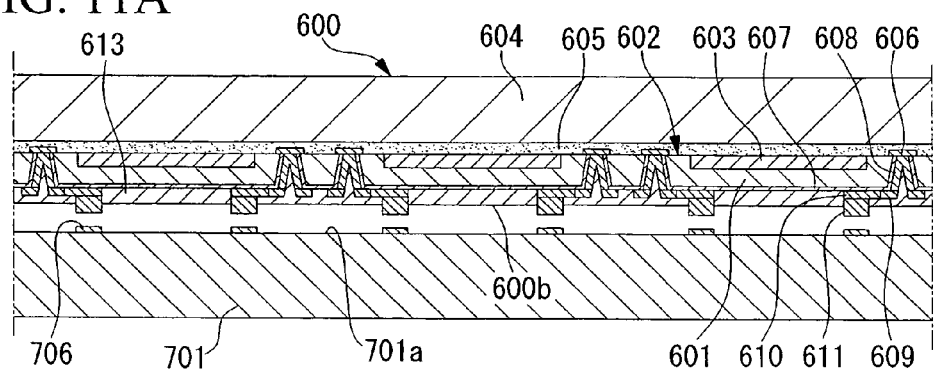
FIG. 11A is an outline cross-sectional view showing an example of a step in the semiconductor package manufacturing process using a semiconductor substrate in wafer form, according to the second aspect of the present invention.

First, as shown in FIG. 10A and FIG. 11A, a semiconductor package 600 obtained according to the manufacturing method of the aforementioned first embodiment, and a semiconductor substrate 701 having a circuit element (not shown), a signal processing circuit (not shown) and electrode pads 706 provided on one surface 701a thereof are prepared.

Figure 11B:
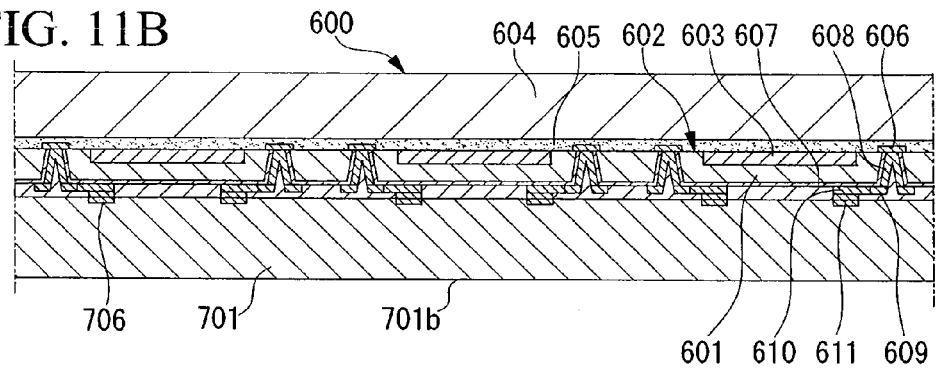
FIG. 11B is an outline cross-sectional view showing an example of a step which follows that of FIG. 11A.

As shown in FIG. 10B and FIG. 11B, the semiconductor package 600 and the semiconductor substrate 701 are bonded together by a method such as thermocompression bonding, so that an electrical connection is established between the metal posts 611 extending from an other surface 600b of the semiconductor package 600, and the electrode pads 706 provided on one surface 701a of the semiconductor substrate 701.

The method used to bond the semiconductor package 600 to the semiconductor substrate 701 is not limited to thermocompression bonding, and any bonding method can be applied, such as metal eutectic bonding and anode bonding, provided that the bonding method does not impair the function of the semiconductor element.

Figure 11C:
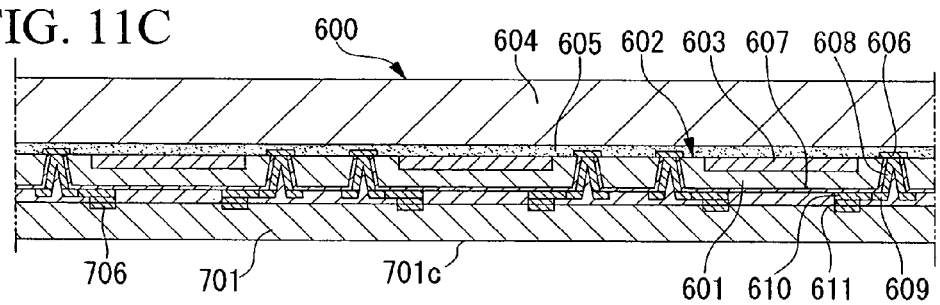
FIG. 11C is an outline cross-sectional view showing an example of a step which follows that of FIG. 11B.

The semiconductor substrate 701 is then polished and thinned down from an other surface 701b side of the semiconductor substrate 701 (see FIG. 10B, FIG. 11C).

In this polishing process, a polishing method which uses a standard chemical mechanical polisher (CMP) or back grinder (BG) is preferred, and yet more preferable is a polishing process which uses both these devices.

In the same manner as the first embodiment, the upper limit in terms of how far the semiconductor substrate 701 can be polished is determined by the maximum depth at which the circuit element (not shown) operates (for example the thickness of the well layer or the buried layer or the like), and the amount of polishing can be determined arbitrarily within this limit. The amount of polishing of the semiconductor substrate 701 can be determined appropriately within the range of the upper limit mentioned above based on the subsequent etching process of the semiconductor substrate 701 and the arrangement of the electrode pads 706.

In addition, the polishing process is not limited to methods using a BG or CMP, and any method may be used provided that the method can thin down the other surface 701b of the semiconductor substrate 701 evenly and does not impede the subsequent etching mask formation process. Examples of polishing methods which may be used include wet etching methods using tetramethylammonium hydroxide (TMAH) solution or potassium hydroxide (KOH) solution or the like, or dry etching methods such as reactive ion etching (RIE) and chemical dry etching (CDE).

As shown in FIG. 10C, the same steps as in the first embodiment are then performed on the thinned-down other surface 701c of the semiconductor substrate 701, to provide through-electrodes 708, external wires 709, external wiring regions 710, metal posts 711 and a protective film 713.

Here, in the steps of forming the through-holes 712, the through-electrodes 708, the external wires 709, the external wiring regions 710 and the metal posts 711, processing of the semiconductor package 600 to enable the package to fulfill its role as the support substrate for the semiconductor substrate 701 can be performed easily.

Furthermore, the external wiring regions 710 and the metal posts 711 are preferably disposed in positions which allow an electrical connection to be established with the external terminals of another substrate (not shown).

Figure 11D:
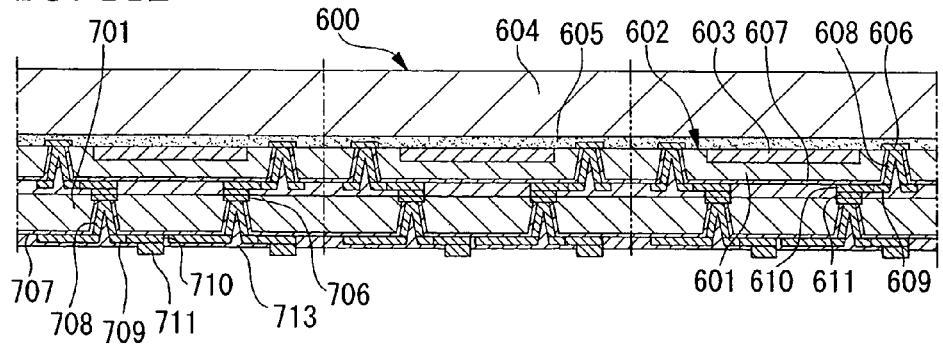
FIG. 11D is an outline cross-sectional view showing an example of a step which follows that of FIG. 11C.

When manufacturing semiconductor packages using a semiconductor substrate in wafer form, the final step is to perform dicing of the semiconductor packages along the dicing line (the alternate dotted and dashed line in FIG. 11D). As a result, a semiconductor package in chip form as shown in FIG. 10C is obtained.

To perform the dicing process, a standard dicing machine or etching machine or the like is used.

In the present invention, the semiconductor element may also be a light emitting element, a standard IC chip, or a micromachine element, as well as the solid-state image sensor used as an example in the second aspect.

Figure 12:
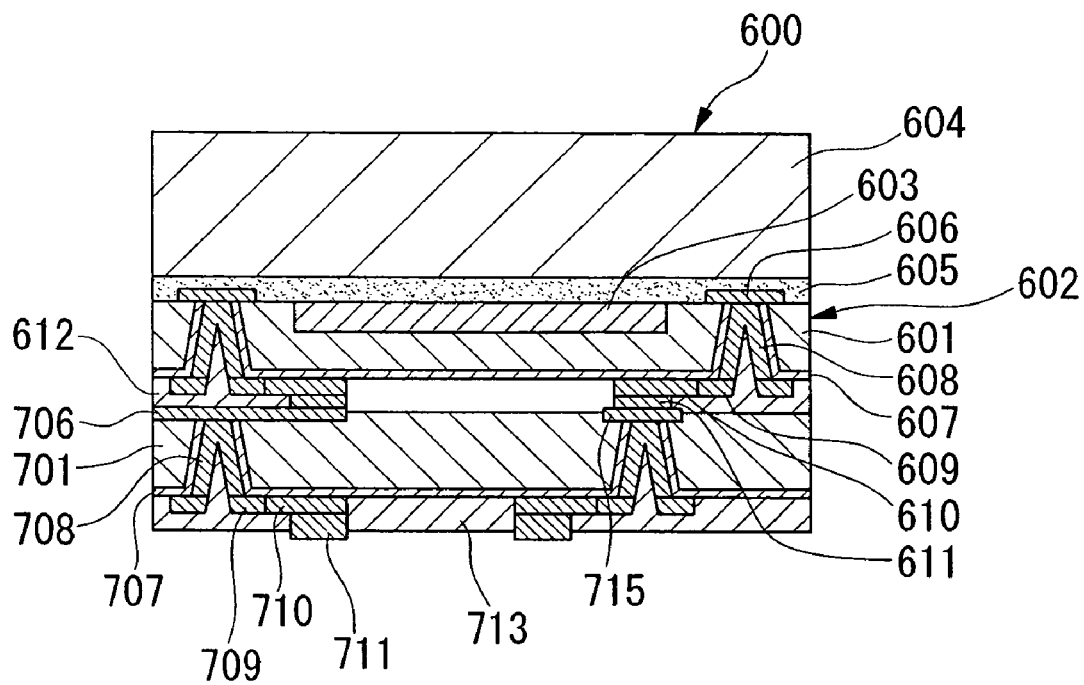
FIG. 12 is an outline cross-sectional view showing an example of a semiconductor pad on which a dummy electrode pad is provided, according to the second aspect of the present invention.
Figure 13:
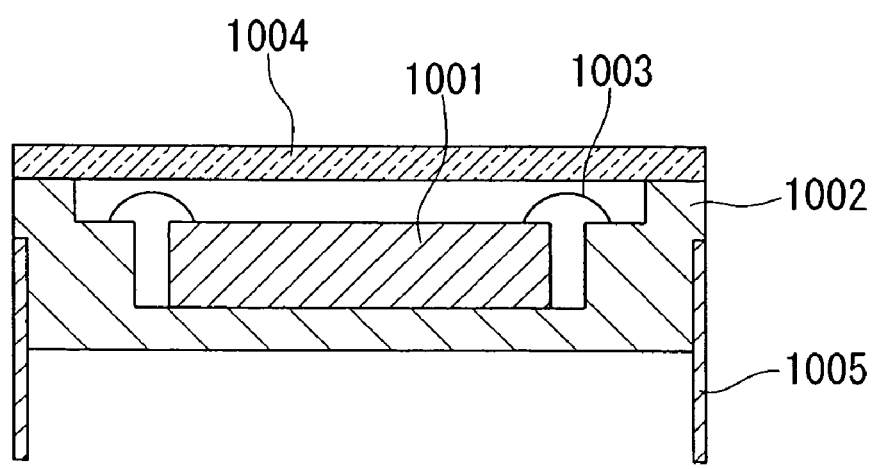
FIG. 13 is an outline cross-sectional view showing an example of a conventional semiconductor package.

Furthermore, as shown in FIG. 12, a dummy electrode pad 715 may be provided on the semiconductor substrate 701, and an electrical connection may be established via this dummy electrode pad 715 between the metal posts 611 of the semiconductor package 600 and the through-electrodes 708 of the semiconductor substrate 701. In this case, the external wires 609 and external wiring regions 610 of the semiconductor package 600 can be drawn out directly to the outside of the semiconductor package, via the external wires 709, the external wiring regions 710 and the through-electrodes 708. In other words, it is also possible for the through-electrodes 708 of the semiconductor substrate 701 to function as an interposer. Such a configuration is effective for use as a power supply line or the like for driving the semiconductor package 600 in FIG. 10C, for example.

In addition, in this second aspect, as shown in FIG. 11A through FIG. 11D, when layering a plurality of semiconductor substrates which are in wafer form, it is necessary for the other semiconductor substrates to have the same electrode placement as the largest semiconductor substrate.

According to the second aspect, wire bonding as performed with packages is not required, and it is possible to establish an electrical connection between the electrode pads on the one surface of the semiconductor substrate and the external terminals of a separate substrate via external wiring, without being limited to the arrangement of the electrode pads on the one surface of the semiconductor substrate, for example.

Furthermore, by covering all parts of the other surface of the semiconductor substrate except for the metal posts with a protective film, a wiring configuration is obtained in which the metal parts on the other surface of the semiconductor substrate are not exposed. Consequently, a semiconductor package with high reliability (high moisture resistance) can be realized.

The through-electrodes and the external wires can all be processed using standard semiconductor manufacturing devices. Consequently, an inexpensive and small semiconductor package can be realized.

Photolithographic techniques used in normal semiconductor manufacturing processes can be applied to the through-electrodes and the external wires. Because the processing accuracy of the through-electrodes and the external wires is determined by the semiconductor photolithographic process, microfabrication is possible. Consequently the semiconductor package of the present invention is readily compatible with other circuit substrates in which the external terminals are formed with a fine pitch using photolithographic techniques, and interconnection of the terminals is possible. As a result it is possible to provide a semiconductor package including a plurality of semiconductor elements in a stacked arrangement, namely a semiconductor package having three dimensional layered wiring.

Furthermore, because in the semiconductor package according to the second aspect, notched regions in the form of V-shaped grooves or the like are not required, none of the semiconductor substrate is wasted, and the yield (area utilization) of the circuit element can be increased.

According to the present invention, in the case in which an external wire which extends from the through-electrode and connects to the external wiring region is provided, photolithographic techniques used in normal semiconductor manufacturing processes can be applied to the external wiring. Consequently, microprocessing is possible for the external wiring, as for the through-electrode. As a result, the semiconductor package of the present invention is readily compatible with other circuit substrates in which the external terminals are formed with a fine pitch using photolithographic techniques, and interconnection of the terminals is possible.

In the case in which the entire other surface side of the semiconductor substrate, excluding the connection section, is covered by a protective film, on the other surface of the semiconductor substrate, the wiring configuration is such that the metal portion is not exposed, and a semiconductor package with high reliability (high moisture resistance) can be realized. Specifically, in a semiconductor package including a solid state image sensor, any deterioration in the performance of the solid state image sensor can be controlled by covering the whole surface except the metal posts with a protective film. Consequently, a low cost CSP level semiconductor package which is both small and highly reliable can be realized without any reduction in performance.

In the case in which the support substrate is made of a material which is optically transparent, the semiconductor package may include, as the circuit element, a solid-state image sensor with a light receiving region (CCD, CMOS for example), or another type of optical element. Consequently, a small semiconductor package which includes a solid-state image sensor or another type of optical element can be provided.

In the case in which the adhesive layer is provided at least on the one surface of the semiconductor substrate, in a region where the electrode pad is provided, the region where the electrode pad is provided which connects to the through-electrode, is adhered to the support substrate directly via the adhesive layer. Therefore physical reinforcement of the through-electrode by the support substrate is achieved. As a result, semiconductor packages can be provided with high yield.

In the case in which the external wiring region is arranged in an opposing relationship to an external terminal, it is easy to electrically connect the external wiring region provided on the other surface of the semiconductor substrate to the external terminal.

In the case in which two or more semiconductor substrates are provided in a layered configuration, it is possible to provide a high function semiconductor package.

In the case in which an external wire for connecting to a terminal of another semiconductor element extends from the through-electrode, it is possible for a given through-electrode on one of the plurality of semiconductor substrates to function as an interposer.

In the case in which those parts of the through-electrode which are bonded to the electrode pad are provided within a plane of the electrode pad, even if the through-electrodes are abnormally shaped in the cross-section direction of the semiconductor package, for example thick in the middle or narrow in the middle (a shape in which the approximate center is thicker or thinner than the ends), a construction in which the entire end face of the through-electrode is bonded completely to the electrode pad can be realized. Accordingly, it is possible to obtain a highly reliable electrical connection due to such factors as low wiring resistance in the connection section between the electrode pad and the through-electrodes. Furthermore, because a state results in which the entire end face of the through-electrode is bonded completely to the electrode pad, there is no heat history related deterioration in characteristics, and therefore the resulting semiconductor package has high environmental reliability.

According to the semiconductor package manufacturing method of the present invention, wire bonding as performed with conventional packages is not required, and it is possible to establish an electrical connection between the electrode pads and the external terminals of a separate substrate via external wiring, without being limited to the arrangement of the electrode pads on the one surface of the semiconductor substrate, for example. Consequently, miniaturization of the semiconductor package can be realized.

Furthermore, the through-electrodes can be processed entirely using standard semiconductor manufacturing equipment. Consequently, a semiconductor package which is both inexpensive and small can be realized.

External wires, for example, can be formed in a given location on the other surface of the semiconductor substrate via the through-electrodes. As a result it is possible to provide a semiconductor package including a plurality of substrates in a stacked arrangement, namely a semiconductor package having three dimensional layered wiring.

Because notched regions such as V-shaped grooves are not required, none of the semiconductor substrate is wasted, and the yield (area utilization) of the circuit element can be increased.

Furthermore, all processes subsequent to the process for bonding and securing the support substrate to the semiconductor substrate are performed from the other surface of the semiconductor substrate. Consequently, damage to the circuit elements during processing by plasma exposure or the like can be reduced.

According to the above, through-electrodes can be formed in a semiconductor substrate manufactured according to standard manufacturing processes, without changing the arrangement or shape of the wiring of the semiconductor substrate. Consequently, semiconductor packages with reduced size, higher functionality and higher density become possible.

In the case in which in the step C, the through-hole is formed so that at least in that part where the through-hole contacts the electrode pad, a cross section of the through-hole is disposed inside the electrode pad, even if the through-holes are abnormally shaped in the cross-section direction of the semiconductor package, for example thick in the middle or narrow in the middle (a shape in which the approximate center is thicker or thinner than the ends), the entire end face of the through-electrode, formed by filling the through-holes with an electroconductive material, can be joined completely to the electrode pad. This has such advantages as a lowering of wiring resistance in the connection section between the electrode pads and the through-electrodes, which results in a highly reliable electrical connection. Furthermore, because the entire end face of the through-electrode can be joined completely with the electrode pad, there is no deterioration in characteristics due to heat history or the like, which enables the manufacture of a semiconductor with high environmental reliability.

In addition, by forming the through-holes so that at least in those parts where the through-holes contact the electrode pads, the cross-section of the through-holes are disposed inside the electrode pads, the electrode pad can act as an etching-stop layer in the etching process used to form the through-holes. Consequently, the process of forming the through-holes can be halted at the point in time when the surfaces of the electrode pads, on the side which is bonded to the semiconductor substrate, are exposed inside the through-holes. Accordingly, such deficiencies as the through-holes penetrating completely through to the surface of the electrode pads can be prevented. Furthermore, the etching performed to form the through-holes does not damage the circuit elements provided on the surface of the semiconductor substrate.

In the case in which after the step D, there is a step in which the entire other surface side of the semiconductor substrate, except for the connection section, is covered with a protective film, a wiring configuration is obtained for the reverse side (the other side) of the semiconductor package in which the metal portions are not exposed, enabling a highly reliable (highly moisture resistant) semiconductor package to be realized.

The semiconductor package and manufacturing method thereof according to the present invention can be applied to wafer level CSP semiconductor packages as well as non-wafer-level-CSP semiconductor packages, and therefore a low cost semiconductor package with high precision and high reliability can be realized.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor package comprising:
   a semiconductor substrate which has a first surface, a second surface, and a through-hole extending from the second surface through to the first surface;
   a semiconductor element provided with a circuit element on the first surface of said semiconductor substrate;
   an external wiring region provided on the second surface of said semiconductor substrate;
   a connection section which is provided on said external wiring region for providing a connection to an external terminal;
   a support substrate disposed on the first surface of said semiconductor substrate;
   an electrode pad provided at an end of said through-hole on the first surface of said semiconductor substrate;
   an electrical insulation film which is provided on the inside surface of said through-hole and which extends from the lower surface of said electrode pad to the second surface of said semiconductor substrate;
   a through-electrode made of a metallic thin film which is formed on said electrical insulation film along the inside surface of said through-hole and which extends from said electrode pad through to the second surface of said semiconductor substrate;
   an external wire which extends from said through-electrode and connects to said external wiring region; and
   a protective film which covers the entire portions of said through-electrode inside said through-hole and the entire second surface side of said semiconductor substrate excluding said connection section.

2. A semiconductor package according to claim 1, wherein an adhesive layer is provided on the first surface of said semiconductor substrate, and this adhesive layer adheres and secures the first surface of said semiconductor substrate to the support substrate.

3. A semiconductor package according to claim 2, wherein said adhesive layer is provided at least on the first surface of said semiconductor substrate, in a region where said electrode pad is provided.

4. A semiconductor package according to claim 1, wherein said electrode pad are disposed on the first surface of said semiconductor substrate in that region where said circuit element is not present.

5. A semiconductor package according to claim 1, wherein said support substrate is made of a material which is optically transparent.

6. A semiconductor package according to claim 1, wherein said external wiring region is arranged in an opposing relationship to an external terminal.

7. A semiconductor package according to claim 1, wherein said semiconductor substrate has a layered configuration in which two or more semiconductor substrates are included, and said support substrate is disposed on the first surface of the uppermost semiconductor substrate.

8. A semiconductor package according to claim 7, wherein an external wire for connecting to a terminal of another semiconductor element extends from said through-electrode.

9. A semiconductor package according to claim 1, wherein those parts of said through-electrode which are bonded to said electrode pad are provided within a plane of said electrode pad.

10. A semiconductor package according to claim 1, wherein the lower surface of said electrode pad is electrically connected to said external wiring region through said through-electrode.

11. A semiconductor package according to claim 1, wherein said electrical insulation film continuously extends from the lower surface of said electrode pad to the second surface of said semiconductor substrate.

* * * * *